United States Patent [19]

Sharpe-Geisler

[11] Patent Number: 5,583,451
[45] Date of Patent: Dec. 10, 1996

[54] POLARITY CONTROL CIRCUIT WHICH MAY BE USED WITH A GROUND BOUNCE LIMITING BUFFER

[75] Inventor: Bradley A. Sharpe-Geisler, San Jose, Calif.

[73] Assignee: Advanced Micro Devices, Inc., Sunnyvale, Calif.

[21] Appl. No.: 453,479

[22] Filed: May 30, 1995

Related U.S. Application Data

[62] Division of Ser. No. 34,549, Mar. 19, 1993, Pat. No. 5,438,277.

[51] Int. Cl.$^6$ ............................................. H03K 19/094
[52] U.S. Cl. ........................ 326/49; 326/50; 326/83; 326/27; 327/256
[58] Field of Search ......................... 326/49, 50, 82, 326/83, 113, 119, 120, 121, 27; 327/256

[56] References Cited

U.S. PATENT DOCUMENTS

| | | | |
|---|---|---|---|
| 4,638,187 | 1/1987 | Boler et al. | 326/27 |
| 4,670,714 | 6/1987 | Sievers et al. | 327/256 |
| 4,717,912 | 1/1988 | Harvey et al. | 326/49 |
| 4,731,553 | 3/1988 | Van Lehn | 326/27 |
| 4,928,023 | 5/1990 | Marshall | 326/27 |
| 5,068,708 | 11/1991 | Newman | 415/844 |
| 5,149,991 | 9/1992 | Rogers | 326/27 |
| 5,204,554 | 4/1993 | Ohannes | 326/33 |
| 5,206,544 | 4/1993 | Chen | 326/30 |
| 5,208,188 | 5/1993 | Newman | 822/330 |
| 5,237,205 | 8/1993 | Newman | 710/416 |
| 5,341,048 | 8/1994 | Randhawa et al. | 327/256 |
| 5,399,921 | 3/1995 | Dobbelaere | 326/113 |
| 5,399,924 | 3/1995 | Goetting et al. | 326/121 |
| 5,412,599 | 5/1995 | Daniele et al. | 326/49 |

FOREIGN PATENT DOCUMENTS

60-257624  12/1985  Japan ................................. 326/113

*Primary Examiner*—Edward P. Westin
*Assistant Examiner*—Benjamin D. Driscoll
*Attorney, Agent, or Firm*—Fliesler, Dubb, Meyer & Lovejoy

[57] ABSTRACT

A polarity control circuit for selectively providing a signal received at a data port to a first output port, and a second complementary output port, with a state as determined by a polarity selection signal provided to the polarity control circuit. The polarity control circuit includes circuitry configured to reduce gate delays.

4 Claims, 8 Drawing Sheets

POLARITY CONTROL CIRCUIT WHICH MAY BE USED WITH A GROUND BOUNCE LIMITING BUFFER

This application is a division of application of Ser. No 08/034,549, filed Mar. 19, 1993, now U.S. Pat. No. 5,438,277.

BACKGROUND OF THE INVENTION

1. Field of the Invention

The present invention relates to output buffers with circuitry to reduce ground bounce and increase circuit operation speed. More particularly, the present invention relates to output buffers for programmable array logic (PAL) devices.

2. Description of the Related Art

Attempts to achieve higher speed from output buffers has resulted in sacrificing output signal distortion due to ground bounce or output signal ringing.

Ground bounce has two outward manifestations: First, with all inputs of a chip referenced to chip ground, if the ground bounce is high enough, 2.4 V for instance, an input at a TTL high can momentarily appear to be a low. Second, an output which is in a low state can momentarily bounce to a high state because the output is effectively connected to chip-ground through the pull-down output transistor.

Figure 1:
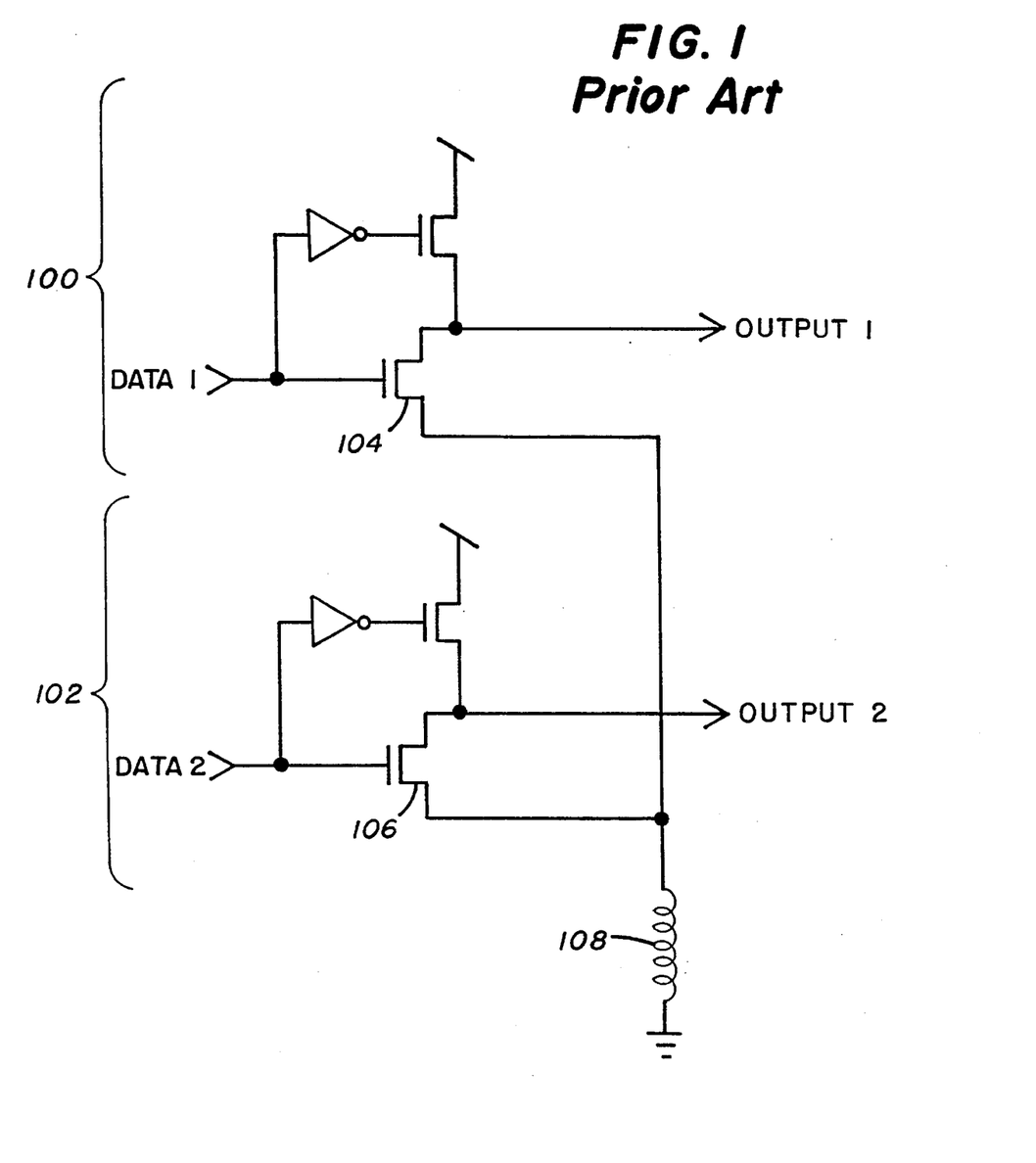
FIG. 1 shows a prior art output driver consisting of two output buffers connected to a common ground.

FIG. 1 illustrates the ground bounce effect with a typical prior art output driver consisting of two output buffers 100 and 102 connected to a common ground lead 108. Assume initially that pull down transistor 104 of buffer 100 is off making output 1 high while pull down transistor 106 is on making output 2 low. When transistor 104 turns on switching output 1 from high to low with transistor 106 remaining on, the increase in current through the ground lead 108 results in a ground bounce that shows up on output 2. Output 2 may thus momentarily appear to be in a high state.

As can be seen from FIG. 1, ground bounce is an undesirable effect often associated with high speed output buffers used on devices containing multiple output buffers such as the AmPALCE22V10 manufactured by Advanced Micro Devices, Inc.

Figure 2:
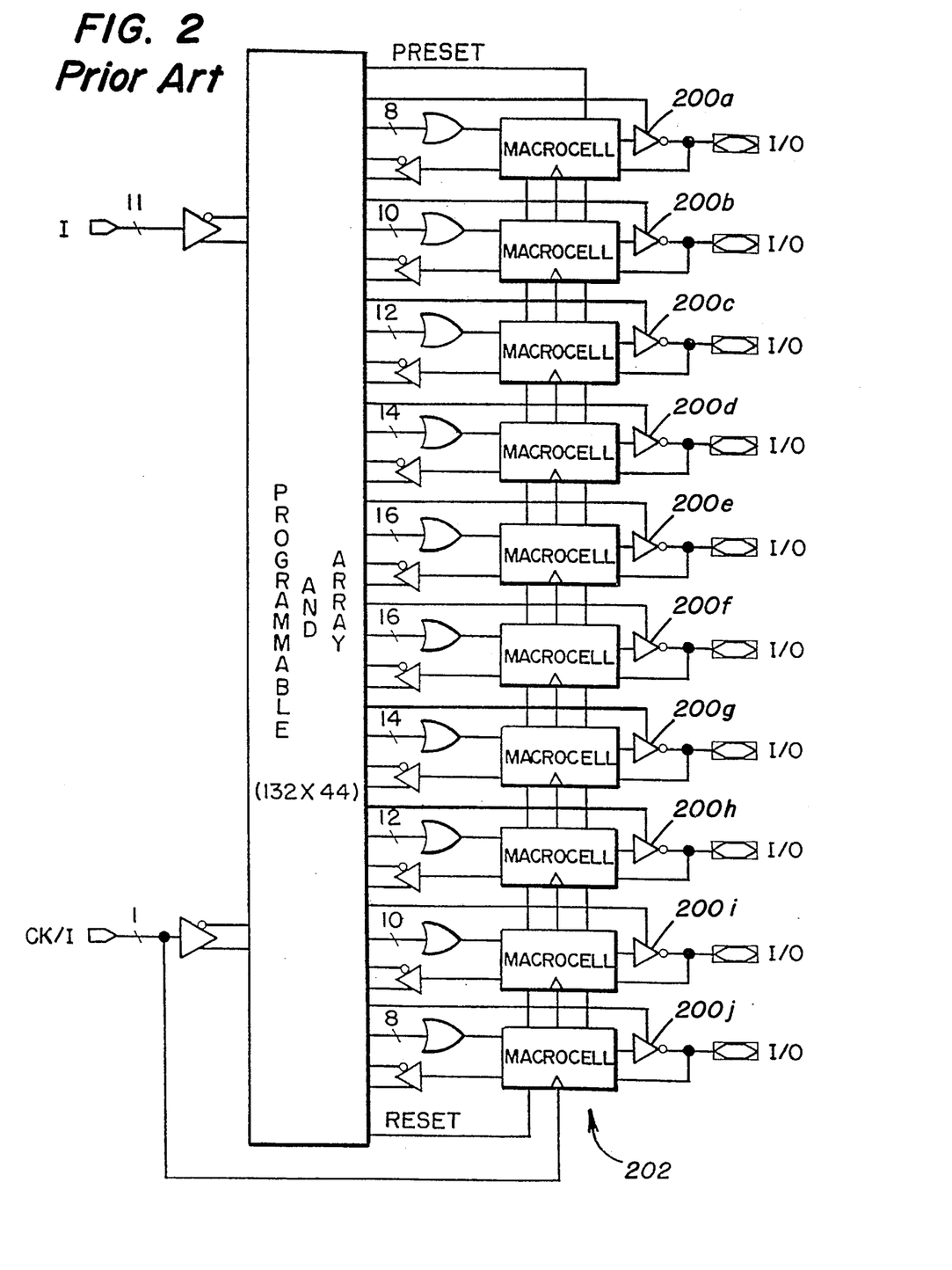
FIG. 2 shows a prior art block diagram for the AmPALCE22V10.

FIG. 2 shows a block diagram for the AmPALCE22V10 with output buffers 200(a–j). Output buffers 200(a–j) receive a signal from programmable array logic through output logic macrocells 202. The output logic macrocells 202 allow selection of whether the output is registered or combinatorial. When a number of output buffers, such as buffers 200(a–j), are hooked to capacitive loads and are switched from high to low simultaneously, the current through the ground lead will increase by an amount equal to the slew-rate times the capacitive load per output times the number of outputs being switched. Ground bounce is equal to the rate of change of this current times the inductance of the ground lead.

In prior art PAL devices ground bounce has been controlled by limiting the slew-rate of the output buffer. In fact, the slew-rate is programmable on the AmPALCE22V10 as well as many other PAL devices. However, by limiting the slew-rate, performance is sacrificed because the lower slew-rate will slow the part down and thus increase propagation delay.

SUMMARY OF THE INVENTION

The present invention provides an output buffer which limits ground bounce without limiting the output buffer slew rate.

The present invention is an output buffer circuit for limiting output ground bounce. The output buffer utilizes two pull down transistors connected to two separate grounds as well as two pull up transistors connected to two separate $V_{DD}$ power supplies. When the buffer output is switched from high to low, a one shot switching means is provided for switching on a first pull down transistor connected to a noisy ground for a short time delay period allowing ground bounce to occur on the noisy ground, and then switching on the second pull down transistor connected to a quiet ground while switching the first pull down transistor off. Similarly, the one shot switching means switches the pair of pull up transistors to turn on a transistor connected to a noisy $V_{DD}$ for a short time delay period until the $V_{DD}$ bounce is over before turning on the transistor connected to a quiet $V_{DD}$ and turning off the transistor connected to the noisy $V_{DD}$, The present invention additionally includes a lead frame with the noisy and quiet ground lines terminating into a single pin. To reduce mutual inductance, the noisy and quiet ground lines overlie a floating conductive plane. To reduce self inductance, the lead width of the noisy ground is made larger than the other leads.

Similar measures to reduce mutual and self inductance are taken with respect to the noisy $V_{DD}$ and quiet $V_{DD}$ lines. Finally, to further reduce self inductance which is more critical to the ground lines than the $V_{DD}$ lines, the noisy and quiet ground line connections on the lead frame are offset from center so that the noisy and quiet ground lines are shorter than the noisy and quiet $V_{DD}$ lines.

The present invention additionally includes circuitry to enable polarity control with a reduced number of gate delays.

BRIEF DESCRIPTION OF THE DRAWINGS

Further details of the present invention are explained with the help of the attached drawings in which.

DESCRIPTION OF THE PREFERRED EMBODIMENTS

Figure 3:
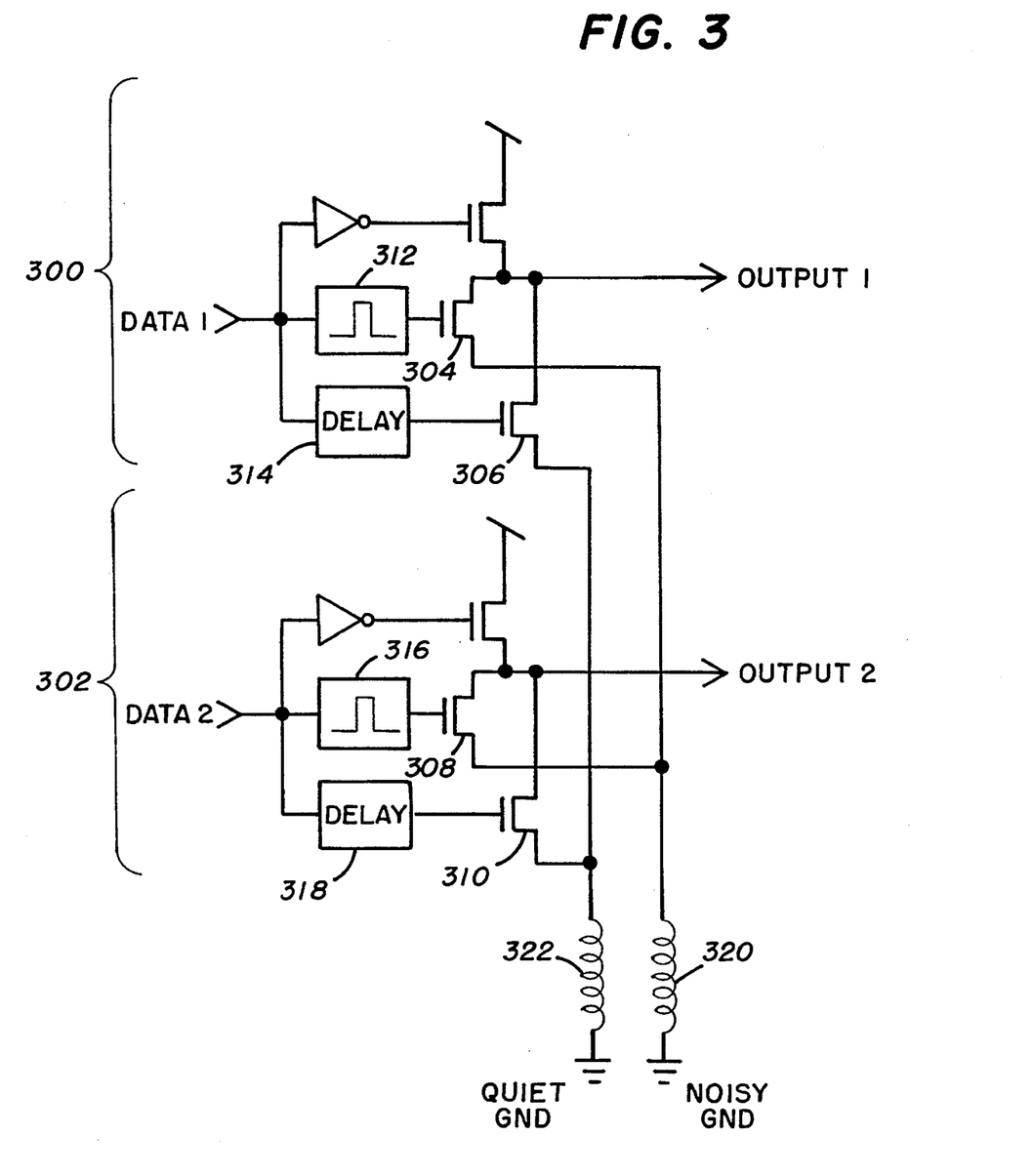
FIG. 3 shows a block diagram of an embodiment of the present invention utilizing an output driver consisting of two output buffers.

FIG. 3 shows a block diagram of an embodiment of the present invention utilizing an output driver consisting of two output buffers 300 and 302. In output buffer 300, a noisy pull down transistor 304 is connected to a noisy ground 320, while a quiet pull down transistor 306 is connected to a quiet ground 322. Likewise, in output buffer 302, a noisy pull down transistor 308 is connected to a noisy ground 320, while a quiet pull down transistor 310 is connected to a quiet ground 322.

Note that transistors referred to herein as noisy or quiet are identified as noisy or quiet for convenience because of their connection to noisy or quiet terminals.

The noisy pull down transistors 304 and 308 are driven by one-shots 312 and 316, the one shots turning the noisy pull down transistors on for only a short time period before turning them off. Quiet pull down transistors 306 and 310 are driven by delayed drivers 314 and 318 which turn on the quiet pull down transistors when the one shot drivers switch the noisy pull down transistors off, thus enabling a buffer output to be held low by a quiet pull down transistor connected to a quiet ground after the noisy pull down transistor is switched off.

In operation, assume initially that noisy pull down transistor 304 and quiet pull down transistor 306 of buffer 300 are off making output 1 high while quiet pull down transistor 310 of buffer 302 is on making output 2 low. When output 1 is switched from high to low, one shot driver 312 turns noisy pull down transistor 304 on, while quiet pull down transistor 306 remains off. Since transistor 304 is connected to noisy ground 320, ground bounce caused by the reactance of ground lead 320 will have little effect on output 2 because transistor 308 of output buffer 302 remains off. When the one shot driver 312 turns noisy pull down transistor 304 off and delayed driver 314 turns quiet pull down transistor 306 on switching current from output 1 to the quiet ground 322, the large quantity of current which potentially causes ground bounce will already be switched. Output 2 will remain unaffected even though quiet pull down transistor 306 is on.

Thus, by utilizing a pair of pull down transistors connected to separate grounds and driving the pull down transistors with a one shot driver in combination with a delayed driver as shown in FIG. 2, ground bounce may be isolated. Outputs in a low state connected to a quiet ground will, therefore, be unaffected by any ground bounce caused by output buffer switching.

Similarly, pull up transistors can be configured with separate power supplies, one shot drivers and delay drivers to provide $V_{DD}$ bounce isolation. Utilizing separate $V_{DD}$ power supplies can reduce the low to high output transition time of the buffer while at the same time limiting noise and facilitating voltage clamping. A quiet $V_{DD}$ may, thus, be connected to an internal supply set at 3.2 volts, while a noisy $V_{DD}$ is set at 5.0 volts. Because the low to high output switching current is handled by the noisy $V_{DD}$ pull-up transistor, the requirements of the 3.2 volt supply, which may be provided on chip, are not unreasonable.

With the circuitry for FIG. 3 utilized in the ten output buffers 200(a-j) of FIG. 2, experimentation was performed to determine output ground bounce on the common quiet ground lead when nine output buffers were switched from high to low, while one output buffer remained low. Ground bounce on the common quiet ground lead was measured to have a peak of 1.04 volts. Utilizing the circuitry for FIG. 1 for the ten output buffers 200(a-j), ground bounce on the ground lead had a peak of 2.18 volts.

Figure 4:
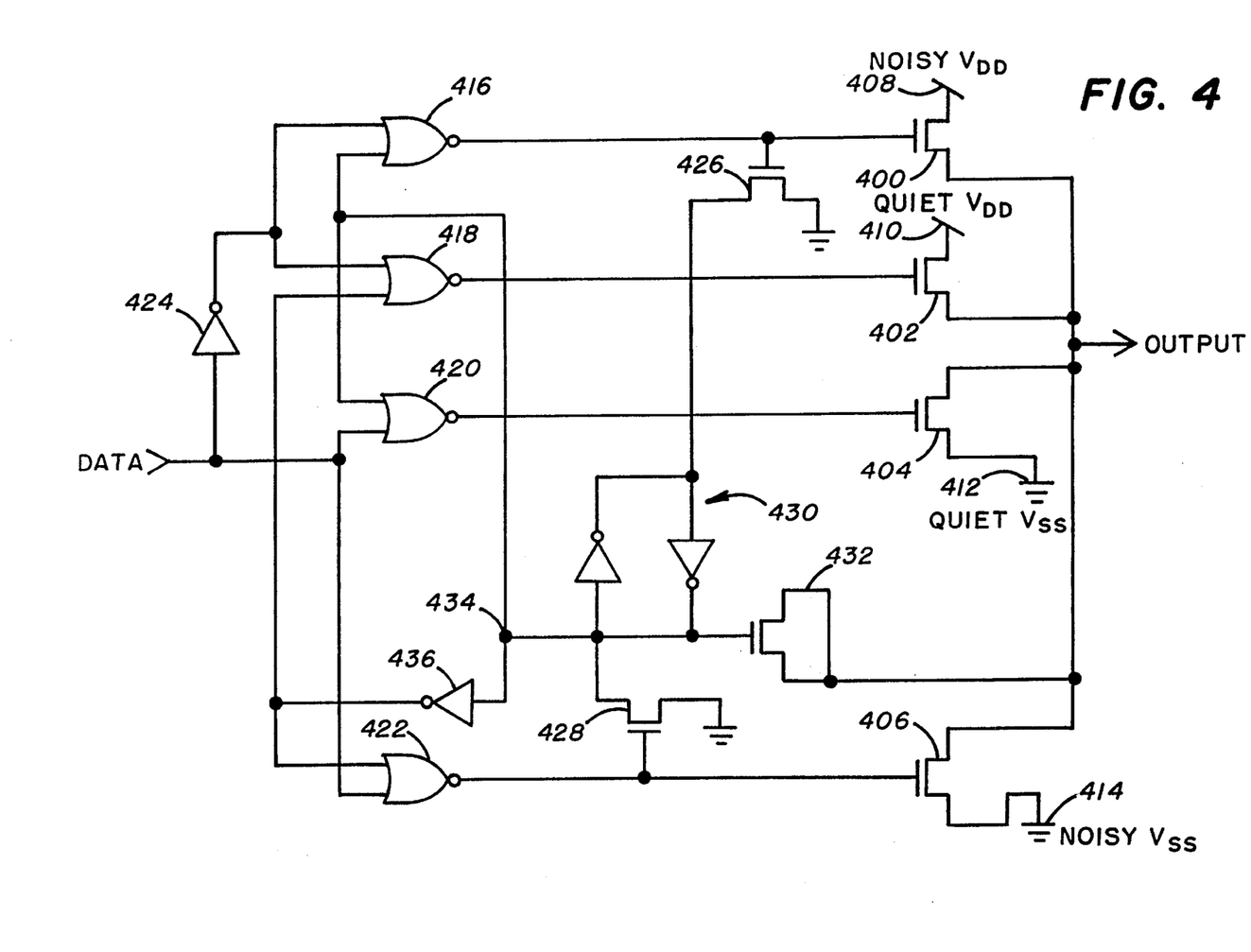
FIG. 4 shows a logic diagram for an embodiment of an output buffer of the present invention.

FIG. 4 shows a logic diagram for an embodiment of an output buffer of the present invention utilizing noisy and quiet pull up transistors 400 and 402 and noisy and quiet pull down transistors 406 and 404. The noisy and quiet pull up-transistors 400 and 402 are connected to noisy and quiet $V_{DD}$ terminals 408 and 410 respectively. Similarly, the noisy and quiet pull down transistors 406 and 404 are connected to noisy and quiet $V_{SS}$ terminals 414 and 412.

Transistors 400, 402, 404 and 406 are enabled using NOR gates 416, 418, 420 and 422. An input data signal is supplied directly to NOR gates 420 and 422, while a complement of the data signal is provided through inverter 424 to NOR gates 416 and 418.

A one shot time delay circuit supplies a time delay signal to NOR gates 416, 418, 420, and 422. The time delay signal is provided by transistors 426 and 428, a latch 430, and a capacitor 432. A first input of the latch 430 is connected to transistor 426 which has its gate connected to the gate of the noisy pull up transistor 400. A second input of the latch 430 is connected to transistor 428 which has its gate connected to the gate of the noisy pull down transistor 406. The second input of the latch 430 is connected to provide a signal directly at node 434 to NOR gates 416 and 420, while a complement of the time delay signal at node 434 is provided through inverter 436 to NOR gates 418 and 422.

The second input of the latch 430 is further connected to a first end of a capacitor 432. The second end of capacitor 432 is connected to the buffer output. The second end of capacitor 432 is connected to the buffer output rather than directly to $V_{SS}$ or ground so that the output slew-rate, which is dependent on external factors, will affect the capacitor discharge rate so that a higher output slew-rate will cause latch 430 to change states more quickly.

In operation, assume initially that latch 430 is set so that node 434 is high, providing a high signal to NOR gates 416 and 420, while a low signal is provided from inverter 436 to NOR gates 418 and 422. Also assume initially the data input signal is high, sending a low signal from inverter 424 so that low signals appear at NOR gates 416 and 418, while high signals appear at NOR gates 420 and 422. In this manner, only NOR gate 418 outputs a high signal turning on quiet pull up transistor 402, while transistors 400, 404 and 406 remain off.

When the data input signal switches from high to low, NOR gate 418 will output a low signal turning off quiet pull up transistor 402 while NOR gate 422 will now output a high signal turning on noisy pull down transistor 406. Simultaneously, transistor 428 will turn on and begin discharging capacitor 432. After a suitable delay to allow ground bounce to dissipate, node 434 will be pulled low, switching latch 430 which will hold the capacitor 432 low providing a high signal to NOR gates 418 and 422 and a low signal to NOR gates 416 and 420. With the data input signal still low, only NOR gate 420 will output a high signal, so the noisy pull down transistor 406 will be switched off and the quiet pull down transistor 404 will be switched on.

When the data input signal switches from low back to high, NOR gate 420 will output a low signal turning off quiet pull down transistor 404 while NOR gate 416 will now output a high signal turning on noisy pull up transistor 400. Simultaneously, transistor 426 will turn on and begin charging capacitor 432 via latch 430. After a suitable delay to allow $V_{DD}$ noise to dissipate, node 434 will be pulled high, switching latch 430 which will hold the capacitor 432 high providing a high signal to NOR gates 416 and 420 and a low signal to NOR gates 418 and 422. With the data input signal still high, only NOR gate 418 will output a high signal, so the noisy pull up transistor 400 will be switched off and the quiet pull up transistor 402 will be switched on.

Figure 5:
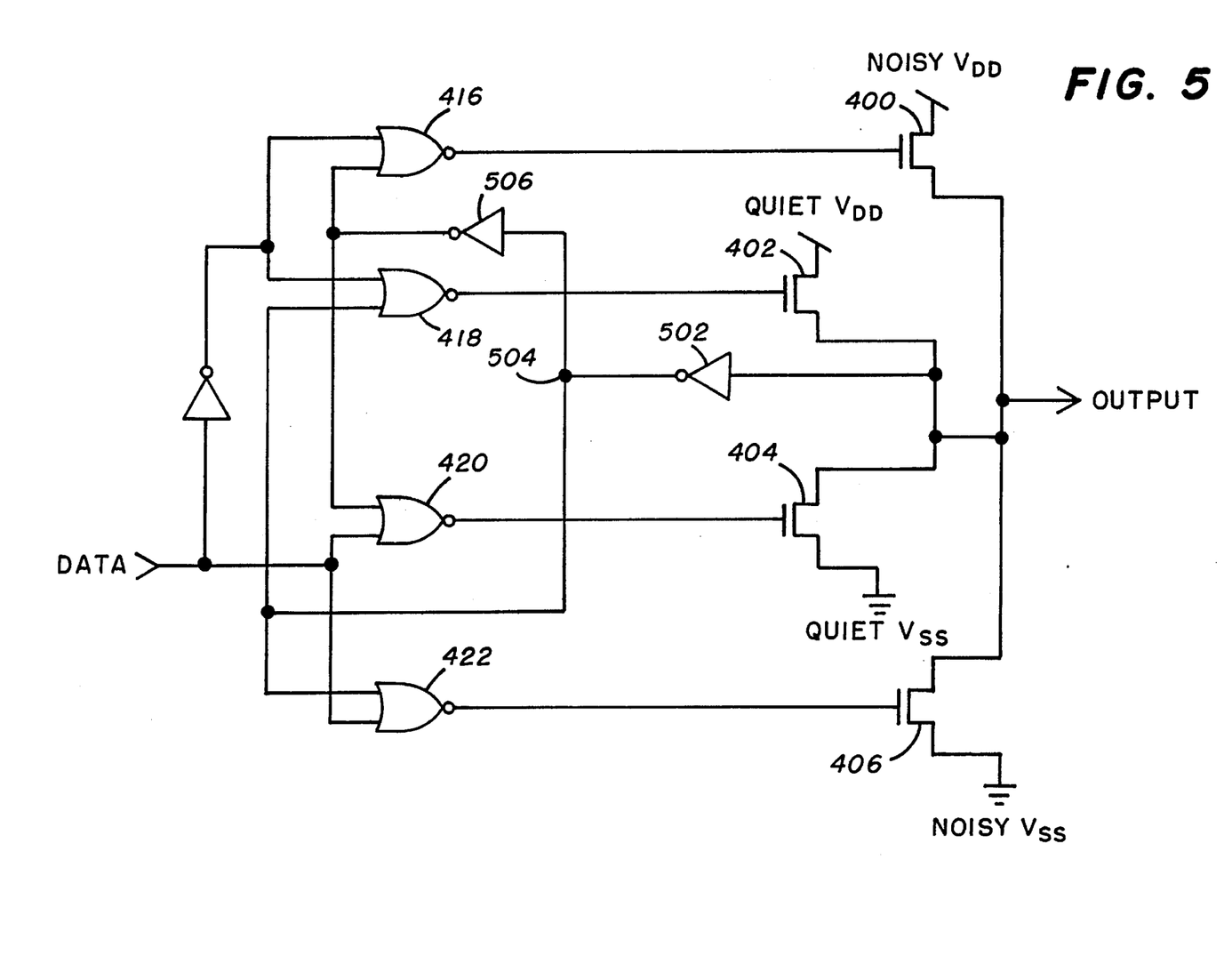
FIG. 5 shows a logic diagram for the buffer circuit of FIG. 4 with a modified one shot time delay circuit.

FIG. 5 shows a logic diagram for the buffer circuit of FIG. 4 with a modified one shot time delay circuit. For convenience, like reference numbers for components in the circuitry of FIG. 4 which are referenced in FIG. 5 are carried over.

The one shot time delay circuit of FIG. 5 consists of an inverter 502 connected from the output to node 504. Node 504 supplies a time delay signal directly to NOR gates 418 and 422, while a complement of the time delay signal at node 504 is provided through inverter 506 to NOR gates 416 and 420.

In operation, assume initially that the data input signal is high and the quiet pull up transistor 402 has been on for some time making the output high. Since the buffer output has been high for a time, inverter 502 will provide a low signal directly to NOR gates 418 and 422, while a high signal is provided from inverter 506 to NOR gates 416 and 420. In this manner, since the data input signal is high, only NOR gate 418 will output a high signal keeping the quiet pull up transistor 402 on, while transistors 400, 404.and 406 remain off.

When the data input signal switches from high to low, NOR gate 418 will output a low signal turning off quiet pull up transistor 402 while NOR gate 422 will now output a high signal turning on noisy pull down transistor 406. After the output is pulled low, node 504 will be pulled high by inverter 502 providing a high signal to NOR gates 418 and 422 and a low signal to NOR gates 416 and 420. With the data input signal still low, only NOR gate 420 will output a high signal, so the noisy pull down transistor 406 will be switched off and the quiet pull down transistor 404 will be switched on.

In a similar manner, when the data input signal switches from low back to high, the quiet pull down transistor 404 will be switched off and noisy pull up transistor 400 will be switched on. Then, after the output switches from low to high, the quiet pull up transistor 402 will be switched on while the noisy pull up transistor 400 is switched off.

Although the one shot time delay circuit of FIG. 5 has less circuitry than the one shot time delay circuitry of FIG. 4, the circuitry of FIG. 4 can respond more rapidly to an input data signal. The circuitry of FIG. 5 requires the buffer output to change state prior to providing the time delay signal which unavoidably occurs because of the propagation delay of the feedback circuitry. The one shot time delay circuitry of FIG. 4 will respond to the data signal directly without requiring a change of state in the output, improving performance of the buffer, particularly when the data signal is rapidly changing states.

The present invention further includes a polarity determination circuit enabling selection of the polarity of the buffer output depending on the polarity of the input data signal with fewer inversions, or gate delays than prior art circuits. To facilitate understanding of the polarity determination circuit of the present invention, a prior art polarity determination circuit will be described as shown in FIG. 6.

Figure 6:
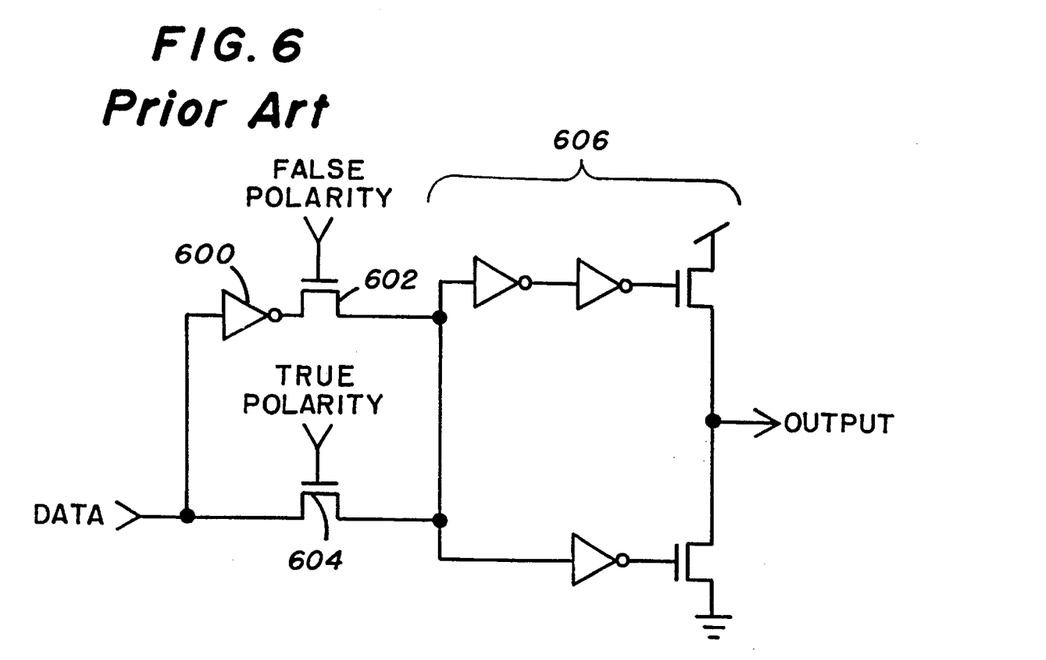
FIG. 6 shows a prior art polarity determination circuit for an output buffer.

In FIG. 6, a data signal is provided to an inverting path and a noninverting path. In the inverting path, an inverter 600 inverts the data signal and provides the inverted data signal to transistor 602. A false polarity signal is provided to the gate of transistor 602 allowing selection of whether the inverted data signal will be passed to the input of a buffer circuit 606.

In the noninverting path, the data signal is provided directly to transistor 604. A true polarity signal is provided to the gate of transistor 604 allowing selection of whether the data signal will be passed to the input of buffer circuit 606.

Figure 7:
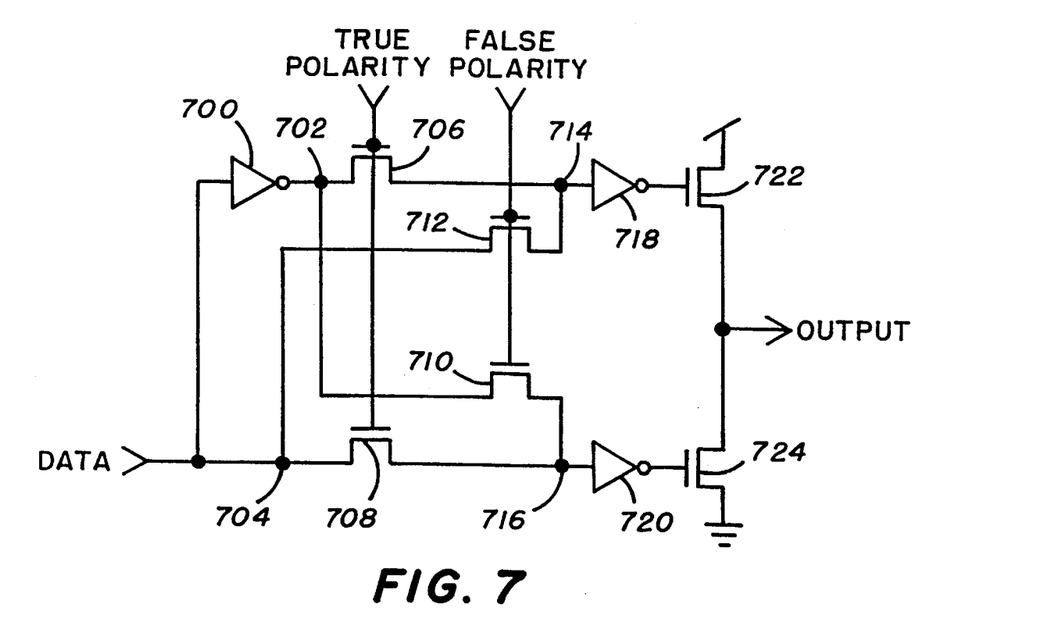
FIG. 7 shows a polarity determination circuit of the present invention.

FIG. 7 shows the polarity determination circuit of the present invention. In FIG. 7, the data signal is again applied to an inverting path and a noninverting path.

In the inverting path, an inverter 700 inverts the data signal and provides the inverted data signal to node 702. At node 702, the inverted data signal is provided through a transistor 706 to a node 714 which is the input to an inverter 718 supplying a pull up transistor 722. A true polarity signal is provided to the gate of transistor 706 allowing selection of whether the inverted data signal will be passed to node 714. At node 702, the inverted data signal is also provided through a transistor 710 to a node 716 which is the input to an inverter 720 supplying a pull down transistor 724. A false polarity signal is provided to the gate of transistor 710 allowing selection of whether the inverted data signal will be passed to node 716.

In the noninverting path the data signal is provided directly to node 704. At node 704, the data signal is provided through a transistor 708 to node 716. A true polarity signal is provided to the gate of transistor 708 allowing selection of whether the noninverted data signal will be passed to node 716. At node 704, the data signal is also provided through a transistor 712 to a node 714. A false polarity signal is provided to the gate of transistor 712 allowing selection of whether the noninverted data signal will be passed to node 714.

In comparing the polarity selection circuitry of FIG. 7 to FIG. 6, one can see that in the inverting path of FIG. 7, two gate delays are caused by inverters, whereas in the inverting path of FIG. 6 three gate delays caused by inverters may occur. Thus, FIG. 7 provides a circuit with potentially fewer inversions or gate delays.

Figure 8:
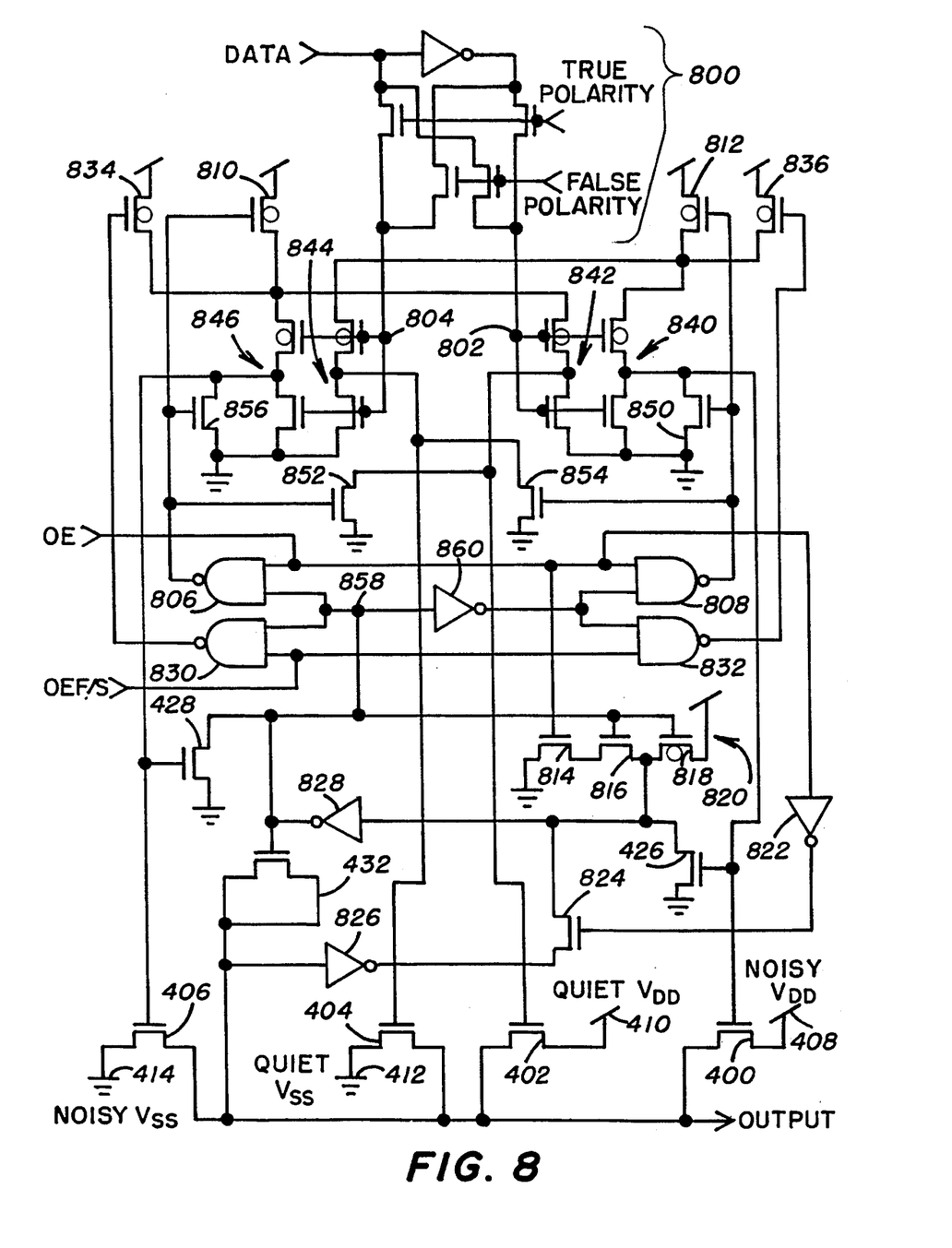
FIG. 8 shows detailed circuitry for an output buffer of the present invention including circuitry from the polarity determination circuit of FIG. 7, slew-rate determination circuitry, and circuitry from the output buffer shown in FIG. 4.

FIG. 8 shows detailed circuitry for an output buffer of the present invention including circuitry from the polarity determination circuit of FIG. 7, slew-rate determination circuitry, and circuitry from the output buffer shown in FIG. 4.

Circuitry 800 from the polarity determination circuit of FIG. 7 is included for inputting a data signal and choosing the data signal polarity. Data input circuitry in FIG. 7 shown connected to node 714 is shown in FIG. 8 connected to node 802, while circuitry in FIG. 7 shown connected to node 716 is shown in FIG. 8 connected to node 804.

FIG. 8 further includes circuitry responsive to a buffer output enabling signal (OE) provided for enabling the buffer. OE is provided to NAND gates 806 and 808, a transistor 814, and to inverter 822. NAND gate 806 is connected to the gates of transistors 810, 852 and 856 while NAND gate 808 is connected to the gates of transistors 812, 850 and 854 to enable the buffer circuitry. The circles on transistors, such as 810 and 812, indicate a P-type transistor, while transistors without the circles are N-type transistors. Transistor 814 connects an inverter 820 formed by transistors 816 and 818 to ground to enable or disable inverter 820. Inverter 822 provides a gate signal to transistor 824 which provides an output path for inverter 826.

In operation, with OE high, NAND gate 806 can enable transistors 810, 852 and 856, while NAND gate 808 can enable transistors 812, 850 and 854. Transistor 814 will be turned on to enable inverter 820 to form a latch consisting of inverters 820 and 828. Inverter 822 will turn off transistor 824 which disables inverter 826. It is given that with OE low, OEF/S will also be low so that NAND gates 806, 808, 830, and 832 are disabled or high. This turns off transistors 834, 810, 812 and 836, and turns on transistors 856, 852, 854 and 850 which will pull the gates of the output transistors 406, 404, 402 and 400 low and so tri-state the output. Transistor 814 disables inverter 820. However, inverter 822 will be on enabling inverter 826 to drive inverter 828 in order to precondition the latch 820, 828 into a state that would be consistent with the output for when the output is enabled, or when OE is high.

FIG. 8 further includes circuitry responsive to an output enable fast or slow (OEF/S) signal to control the buffer slew-rate. OEF/S is provided to NAND gates 830 and 832 which are connected to the gates of transistors 834 and 836 respectively. Transistor 834 is connected in parallel with transistor 810 controlled by the OE signal, while transistor 836 is connected in parallel with transistor 812 also controlled by the OE signal. In operation, with OE on and OEF/S off, NAND gates 806 and 808 enable transistors 810 and 812 to supply power. However, with both OE on and OEF/S on, NAND gates 830 and 832 enable transistors 834 and 836 connected in parallel with transistors 810 and 812 respectively to supply more current, thus increasing the buffer slew-rate.

FIG. 8 further includes more detailed circuitry for the output buffer shown in the logic diagram of FIG. 4. For convenience, like reference numbers for components in the circuitry of FIG. 4 which are referenced in FIG. 8 are carried over.

FIG. 8 utilizes noisy and quiet pull up transistors 400 and 402 and noisy and quiet pull down transistors 406 and 404. The noisy and quiet pull up transistors 400 and 402 are connected to noisy and quiet $V_{DD}$ terminals 408 and 410 respectively. Similarly, the noisy and quiet pull down transistors 406 and 404 are connected to noisy and quiet $V_{SS}$ terminals 414 and 412.

Transistors 400, 402, 404 and 406 are enabled using transistor pairs 840, 842, 844 and 846 respectively. Transistor pairs 840, 842, 844 and 846 each include pull up and pull down transistors. For transistor pairs 840 and 846 connected to noisy pull up and pull down transistors 400 and 406, the pull up transistor of the transistor pair has a width of approximately 60 microns, while the pull down transistor of the transistor pair has a width of ten microns. For transistor pairs 842 and 844 connected to quiet pull up and pull down transistors 402 and 404, the pull up transistor of the transistor pair has a width of approximately 10 microns while the pull down transistor of the transistor pair has a width of approximately 25 microns.

The sizes of the transistors which make up NAND gates 806, 830, 808, and 832 and inverter 860 will result in urn on of the quiet pull down transistor 404 prior to turn off of the noisy pull down transistor 406, turn on of the quiet pull up transistor 402 prior to turn off of the noisy pull up transistor 400. The sizes of the pull up and pull down transistors for the transistor pairs 840, 842, 844, and 846 are chosen to enable turn on of the noisy pull down transistor 406 and to turn off of the quiet pull up transistor 402 as rapidly as possible, but such that the turn off of the quiet pull up transistor 402 slightly precedes turn on of the noisy pull down transistor 406 and, turn on of the noisy pull up transistor 400 and to turn off of the quiet pull down transistor 404 as rapidly as possible such that the turn off of the quiet pull up transistor 402 slightly precedes turn on of the noisy pull down transistor 406.

The pull down transistors of transistor pairs 840, 842, 844 and 846 are connected in parallel with transistors 850, 852, 854 and 856 respectively. NAND gate 808 enables transistors 850 and 854 which enable transistor pairs 840 and 844 while NAND gate 806 enables transistors 852 and 856 which enable transistor pairs 842 and 846.

An input data signal is provided from circuitry 800 directly to transistor pairs 844 and 846 at node 804 while a complement of the data signal is provided to transistor pairs 840 and 842 at node 802.

A one shot time delay circuit supplies a time delay signal to transistor pairs 840, 842, 844 and 846 through NAND gates 806, 808, 830 and 832 with NAND gates 806, 808, 830, and 832 enabled. A time delay signal is provided by transistors 426 and 428, a latch consisting of inverters 820 and 828, and a capacitor 432. A first input of the latch 820, 828 is connected to transistor 426 which has its gate connected to the gate of the noisy pull up transistor 400. A second input of the latch 826, 828 is connected to transistor 428 which has its gate connected to the gate of the noisy pull down transistor 406. The second input of the latch 820, 828 is also connected to provide a signal directly at node 858 to NAND gates 806 and 830, while a complement of the time delay signal at node 858 is provided through inverter 860 to NAND gates 808 and 832.

The second input of the latch 820, 828 is further connected to a first end of a capacitor 432. The second end of capacitor 432 is connected to the buffer output. The second end of capacitor 432 is connected to the buffer output rather than directly to $V_{SS}$ so that a higher output slew-rate will cause latch 820, 828 to change states more quickly.

In operation, assume initially that a true polarity is chosen and that OE is high enabling NAND gates 806 and 808 and inverter 820, while disabling inverter 826. Assume further that OEF/S is high enabling NAND gates 830 and 832.

Further, assume that the latch formed by inverters 820 and 828 is set so that node 858 is high. Node 858 will then provide a high signal to NAND gate 806 turning on transistor 810 and turning off transistors 852 and 856 connected to transistor pairs 842 and 846, while a low signal is provided from inverter 860 to NAND gate 808 turning off transistor 812 and turning on transistors 850 and 852 which disables transistor pairs 840 and 844 and ensures output transistors 400 and 404 are off.

Assume also that the data input signal is high sending a low signal to node 802 to enabled transistor pair 842, while a high signal is provided to node 804 to enabled transistor pair 846.

In this manner, only transistor pair 842 outputs a high signal turning on quiet pull up transistor 402, while transistors 400, 404 and 406 remain off.

When the data input signal switches from high to low, a high signal will be applied to enabled transistor pair 842 turning off quiet pull up transistor 402 while a low signal will be applied to enabled transistor pair 846 turning on noisy pull down transistor 406. Simultaneously, transistor 428 will turn on and begin discharging capacitor 432. After a suitable delay to allow ground bounce to dissipate, node 858 will be pulled low, switching latch 826, 828 which will hold the capacitor and thus node 858 low.

Node 858 will provide the low signal to NAND gate 806 turning off transistors 810 and turning on transistors 852 and 856 disabling transistor pairs 842 and 846 ensuring output transistors 402 and 406 are off, while a high signal will be provided from inverter 860 to NAND gate 808 turning on transistor 812 and turning off transistors 850 and 854 connected to transistor pairs 840 and 844.

With the data input signal still low and only transistor pairs 840 and 844 enabled, only transistor pair 844 will output a high signal, so the noisy pull down transistor 406 will be switched off and the quiet pull down transistor 404 will be switched on.

In a similar manner, when the data input signal switches from low back to high, the quiet pull down transistor 404 will be switched off and noisy pull up transistor 400 will be switched on. Then, after a time delay, a time delay signal will be provided in a manner similar to that described with respect to FIG. 4, so that quiet pull up transistor 402 will be switched on while the noisy pull up transistor 400 is switched off.

Figures 9, 10, 11, 12:
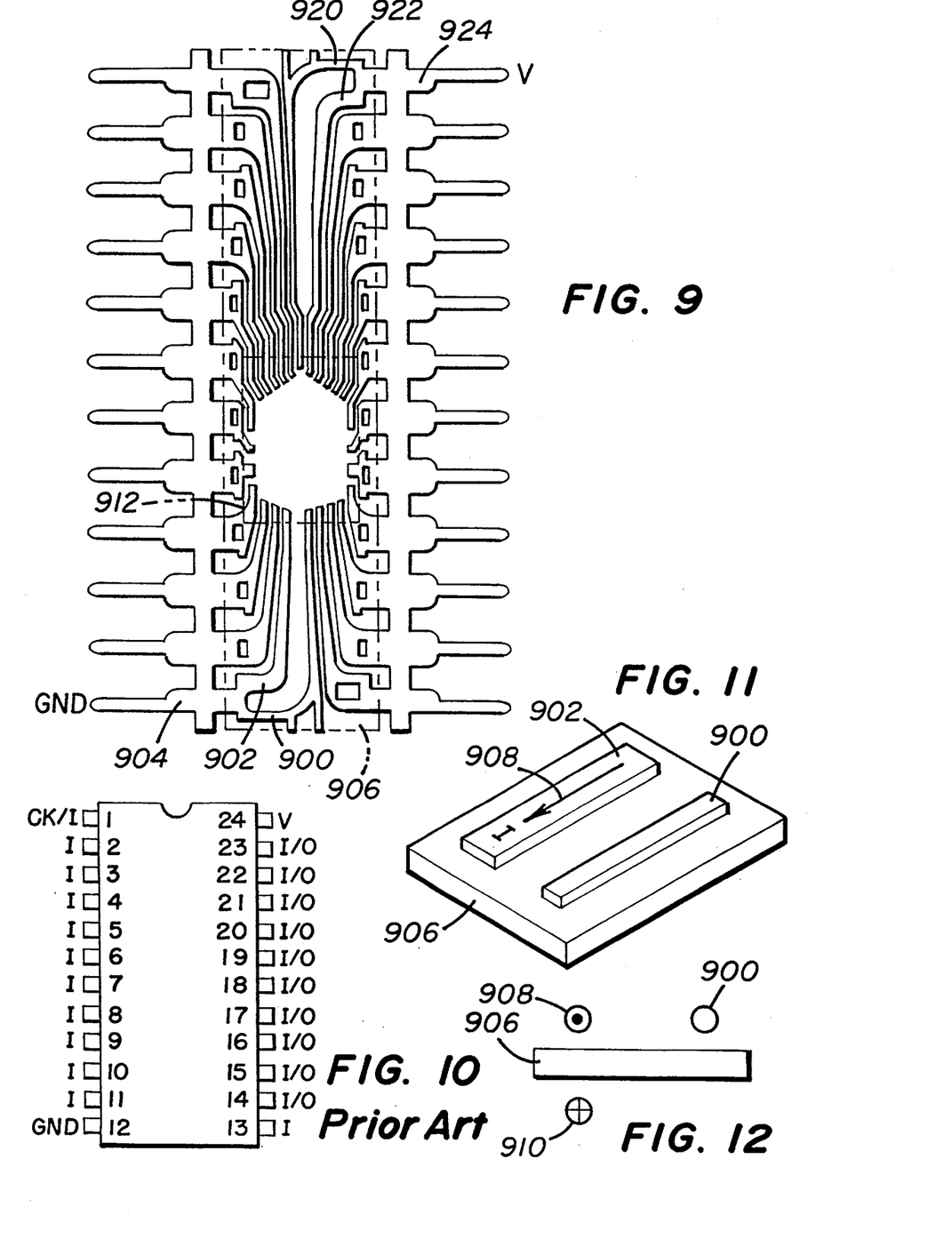
FIG. 9 shows a special lead frame for a 24 pin DIP package for installation of output buffers of the present invention on a device utilizing a limited number of pins.
FIG. 10 shows a pin diagram for the AmPALCE22V10.
FIG. 11 illustrates current flow in a noisy lead of a noisy and quiet lead pair positioned above a floating conductive plane.
FIG. 12 illustrates mutual inductance between a noisy and quiet lead pair placed above a floating conductive plane.

In a device such as the AmPALCE22V10 shown in FIG. 2, the number of pins may be limited to 24 such as when the AmPALCE22V10 is utilized on the 24 pin DIP package shown in FIG. 10. With inputs, outputs and clock signals of the AmPALCE22V10 occupying 22 terminals, only two pins are left available for the $V_{DD}$, shown as pin 24 labeled V, and $V_{SS}$, shown as pin 12, labeled GND in FIG. 10.

To utilize the buffers of the present invention, as shown in FIGS. 3, 4, 5 and 8, on a chip, separate leads must be provided to separate the noisy $V_{DD}$ of the buffer from the quiet $V_{DD}$ of the buffer and remaining $V_{DD}$ connections for circuitry on the chip. Further, separate leads must be provided to separate the noisy $V_{SS}$ of the buffer from the quiet $V_{SS}$ of the buffer and remaining $V_{SS}$ connections for circuitry on the chip.

FIG. 9 shows a special lead frame for a 24 pin DIP package for installation of output buffers of the present invention on a device utilizing a limited number of pins. In FIG. 9, GND and V pins are labeled similar to FIG. 10, and it is assumed that no other pin is available for $V_{SS}$, but the GND pin and that no other pin is available for $V_{DD}$, but the V pin.

Referring first to the $V_{SS}$, or GND pin, a quiet $V_{SS}$ lead portion 900 is provided separate from a noisy $V_{SS}$ portion 902. The quiet and noisy lead portions 900 and 902 terminate in a terminal portion 904 forming the GND pin which can be connected to external circuitry. For the separate quiet and noisy lead portions 900 and 902, measures are taken to reduce inductance which creates ground bounce or output ringing.

First, to reduce mutual inductance, a floating conductive plane 906 shown by dashed lines, is provided beneath the quiet and noisy lead portions 900 and 902. The floating conductive plane is provided to reduce mutual inductance which is created by current in the noisy lead portion 902 generating a magnetic field B which induces a voltage in the quiet lead portion 902. Without the floating conductive plane 906, the voltage generated in the quiet lead portion 900 will be roughly proportional to 1/r where r is the distance between the quiet and noisy lead portions 900 and 902. With the floating conductive plane 906, the high frequency components of the current 908 traveling in a noisy lead portion 902, as shown in FIG. 11, will induce eddy currents that will result in a magnetic field above the floating plane 906 that would be identical to one generated by the mirror image of the noisy lead below the floating conducting plane as shown in FIG. 12 with current 910 flowing in the opposite direction. The high frequency component of the magnetic field below the floating conductive plane will be zero. Because the two currents 906 and 910 generate magnetic fields which work against each other to generate voltage in the quiet lead portion 900, the voltage induced in the quiet lead portion 900 can be reduced by as much as a factor of 10.

Second, to reduce self inductance, the noisy lead portion 902 is first made with a line width which is wider. Additionally, a cavity 912 shown by dashed lines where the leads are cut is moved toward the GND pin. Although moving the cavity 912 makes the lines for the V pin longer, ground bounce on quiet and noisy $V_{SS}$ leads has been shown to be more significant than noise on $V_{DD}$ leads, requiring reduction of the $V_{SS}$ leads at the expense of leads connected to the V pin.

Referring now to the $V_{DD}$ or V pin, similar to the GND pin, a quiet $V_{DD}$ lead portion 920 is provided separate, from a noisy $V_{DD}$ lead portion 922. The quiet and noisy lead portions 920 and 922 terminate in a terminal portion 924 forming the V pin which can be connected to external circuitry. Additionally similar to the GND pin, to reduce mutual inductance a floating conductive plane 906 is provided beneath the quiet and noisy lead portions 920 and 922. Further, to reduce self inductance the line width of the noisy lead portion 920 is made wider.

Although the invention has been described above with particularity, this was merely to teach one of ordinary skill in the art how to make and use the invention. Many modifications will fall within the scope of the invention, as that scope as defined by claims provided below. For instance, TTL circuitry may be utilized in place of the CMOS circuitry. Although, ground bounce has less effect on TTL circuitry, performance of a buffer using TTL circuitry will be improved utilizing the present invention.

What is claimed is:

1. A polarity determination and buffering circuit for receiving a data signal and a polarity signal, the polarity signal having a false state if the data signal is to be inverted and a true state if the data signal is not to be inverted, the circuit comprising:

a data port for receiving a data signal;

a polarity determination port for receiving the polarity signal;

a first polarity determination output port;

a second polarity determination output port;

an inverting means coupled to the data port for receiving and inverting the data signal from the data port;

a first inverting path formed by a source to drain path of a first transistor coupling the inverting means to the first polarity determination output port, a gate of the first transistor being coupled to the polarity determination port to allow current to flow between the first transistor source and drain when the polarity signal is in the true state;

a second inverting path formed by a source to drain path of a second transistor coupling the inverting means to the second polarity determination output port, a gate of the second transistor being coupled to the polarity determination port to allow current to flow between the second transistor source and drain when the polarity signal is in the false state;

a first noninverting path formed by a source to drain path of a third transistor coupling the data port to the second polarity determination output port, a gate of the third transistor being coupled to the polarity determination port to allow current to flow between the third transistor source and drain when the polarity signal is in the true state;

a second noninverting path formed by a source to drain path of a fourth transistor coupling the data port to the first polarity determination output port, a gate of the fourth transistor being coupled to the polarity determination port to allow current to flow between the fourth transistor source and drain when the polarity signal is in the false state;

a noisy pull down transistor having a source to drain path connecting a buffer output to a low power supply, and having a gate;

a quiet pull down transistor having a source to drain path connecting the buffer output to the low power supply, and having a gate;

a noisy pull up transistor having a source to drain path connecting the buffer output to a high power supply, and having a gate;

a quiet pull up transistor having a source to drain path connecting the buffer output to the high power supply, and having a gate;

a first NOR gate having a first input connected to the second polarity determination output port, an output connected to the gate of the noisy pull up transistor, and a second input;

a second NOR gate having a first input connected to the second polarity determination output port, an output connected to the gate of the quiet pull up transistor, and a second input;

a third NOR gate having a first input connected to the first polarity determination output port, an output connected to the gate of the quiet pull down transistor, and a second input;

a fourth NOR gate having a first input connected to the first polarity determination output port, an output connected to the gate of the noisy pull down transistor, and a second input; and a time delay means coupled to the second input of the first, second, third and fourth NOR gates for providing a time delay signal in response to a change of state in the input data signal after a predetermined time delay, the time delay means providing the time delay signal to the second input of the first and third NOR gates, the time delay means providing an inverse of the time delay signal to the second input of the second and fourth NOR gates.

2. The polarity determination circuit of claim 1 wherein the time delay means comprises:

a latch having an input and an output;

a capacitive transistor having a gate connected to the latch input and a source and drain connected to the buffer output:

a first switching transistor with a gate connected to output of the first NOR gate, and a source to drain path connected from the latch output to the low power supply; and a second switching transistor with a gate connected to the output of the fourth NOR gate, and a source to drain path connected the latch input to the low power supply.

3. A polarity determination and buffering circuit for receiving a data signal and a polarity signal, the polarity signal having a false state if the data signal is to be inverted and a true state if the data signal is not to be inverted, the circuit comprising:

a data port for receiving a data signal;

a polarity determination port for receiving the polarity signal;

a first polarity determination output port;

a second polarity determination output port;

an inverting means coupled to the data port for receiving and inverting the data signal from the data port;

a first inverting path formed by a source to drain path of a first transistor coupling the inverting means to the first polarity determination output port, a gate of the first transistor being coupled to the polarity determination port to allow current to flow between the first transistor source and drain when the polarity signal is in the true state;

a second inverting path formed by a source to drain path of a second transistor coupling the inverting means to the second polarity determination output port, a gate of the second transistor being coupled to the polarity determination port to allow current to flow between the second transistor source and drain when the polarity signal is in the false state;

a first noninverting path formed by a source to drain path of a third transistor coupling the data port to the second polarity determination output port, a gate of the third transistor being coupled to the polarity determination port to allow current to flow between the third transistor source and drain when the polarity signal is in the true state; and a second noninverting path formed by a source to drain path of a fourth transistor coupling the data port to the first polarity determination output port, a gate of the fourth transistor being coupled to the polarity determination port to allow current to flow between the fourth transistor source and drain when the polarity signal is in the false state;

a first buffer transistor having a source to drain path coupling $V_{DD}$ to a buffer output, and having a gate coupled to the first polarity determination output port; and a second buffer transistor having a source to drain path coupling the buffer output to $V_{SS}$, and having a gate coupled to the second polarity determination output port.

4. A polarity determination and buffering circuit for receiving a data signal at a data port and a polarity control signal, the circuit comprising:

an inverter having an input connected to the data port, and an output;

a first transistor having a source to drain path coupling the output of the inverter to a first polarity determination output port, and a gate connected to receive the polarity control signal;

a second transistor having a source to drain path coupling the output of the inverter to a second polarity determination output port, and a gate connected to receive an inverse of the polarity control signal;

a third transistor having a source to drain path coupling the data port to the second polarity determination output port, and a gate connected to receive the polarity control signal;

a fourth transistor having a source to drain path coupling the data port to the first polarity determination output port, and a gate connected to receive the inverse of the polarity control signal;

a first buffer transistor having a source to drain path coupling $V_{DD}$ to a buffer output, and having a gate coupled to the first polarity determination output port; and a second buffer transistor having a source to drain path coupling the buffer output to $V_{SS}$, and having a gate coupled to the second polarity determination output port.

* * * * *